United States Patent [19]

Gawronski et al.

[11] 4,232,278
[45] Nov. 4, 1980

[54] HIGH POWER MICROWAVE INTEGRATED CIRCUIT RECEIVER PROTECTOR WITH INTEGRAL SENSITIVITY TIME CONTROL

[75] Inventors: Michael J. Gawronski, Baltimore; Harry Goldie, Randallstown, both of Md.

[73] Assignee: The United States of America as represented by the Secretary of the Air Force, Washington, D.C.

[21] Appl. No.: 55,423

[22] Filed: Jul. 6, 1979

[51] Int. Cl.$^3$ .......................... H01P 1/15; H04B 1/10
[52] U.S. Cl. .................................... 333/13; 333/17 L; 333/247; 455/80
[58] Field of Search ............... 333/13, 17 L, 246, 247, 333/262, 81 A; 325/22-24, 362; 343/175, 180

[56] References Cited

U.S. PATENT DOCUMENTS 2,798,186 7/1957 Caithness .................. 333/13 UX
3,452,299 6/1969 Angel ......................... 333/13 X Primary Examiner—Paul L. Gensler
Attorney, Agent, or Firm—Joseph E. Rusz; Robert Kern Duncan

[57] ABSTRACT

PIN diodes of decreasing base region thicknesses, wherein the thickest base region diode functions as a quasi-active limiter with turn-on bias supplied by detected RF current in a Schottky barrier diode with a discharge resistor providing fast recovery; and the thinnest base region PIN diode being a zero bias punch-through type, with a dc sensitivity time control, functioning as a passive limiter during transmit and controlled attenuator during receive provides an improved radar receiver protector circuit. The operation of the PIN diode is enhanced by a unique mounting on a gold-plated copper puck in the circuit board and tuning the signal leads to the diode.

3 Claims, 10 Drawing Figures

HIGH POWER MICROWAVE INTEGRATED CIRCUIT RECEIVER PROTECTOR WITH INTEGRAL SENSITIVITY TIME CONTROL

RIGHTS OF THE GOVERNMENT

The invention described herein may be manufactured and used by or for the Government of the United States for all governmental purposes without the payment of any royalty.

BACKGROUND OF THE INVENTION

Transmit-Receive (T/R) switches have been known since the advent of radar. Some early models were substantially nothing more than a spark gap strategically positioned (electrically) in the transmission line coupling the receiver to the antenna, to prevent high power transmitted pulses to the antenna from damaging the input circuits to the receiver. From the beginning two requirements have predominated, one, low insertion loss so that the receiver's system noise factor (NF) is not seriously impaired on receive, and two, adequate protection for the receiver during transmission. In addition to further increasing the magnitude of these requirements, modern radar systems have imposed many more requirements both technically, such as higher power levels, longer pulses, faster response time, and higher frequencies; and physically, such as small size construction, microwave integrated circuit (MIC) structure, passive protection, and integral sensitivity time control.

The following patents may provide valuable background teaching in the understanding of the present disclosure. U.S. Pat. No. 2,835,867 to patentee Golden, U.S. Pat. No. 2,847,159 to Curtis, U.S. Pat. No. 2,994,789 to Gottfried, U.S. Pat. No. 3,226,661 to Garver et al, U.S. Pat. No. 3,321,642 to Peterson, U.S. Pat. No. 3,484,308 to Lesk, U.S. Pat. No. 3,529,266 to King, U.S. Pat. No. 3,605,027 to Nichols et al, U.S. Pat. No. 3,774,123 to Hume, U.S. Pat. No. 3,810,049 to Krause, and U.S. Pat. No. 3,846,724 to Maier.

BRIEF SUMMARY OF THE INVENTION

A novel microwave integrated circuit is disclosed including a novel mounting for PIN diodes to provide a receiver protector having high input power capability, long-pulse capability, fast recovery, fast turn-on, low insertion loss and low volt-standing-wave-ratio (VSWR).

BRIEF DESCRIPTION OF THE VIEW OF THE DRAWING

DESCRIPTION OF THE PREFERRED EMBODIMENT

Figure 1:
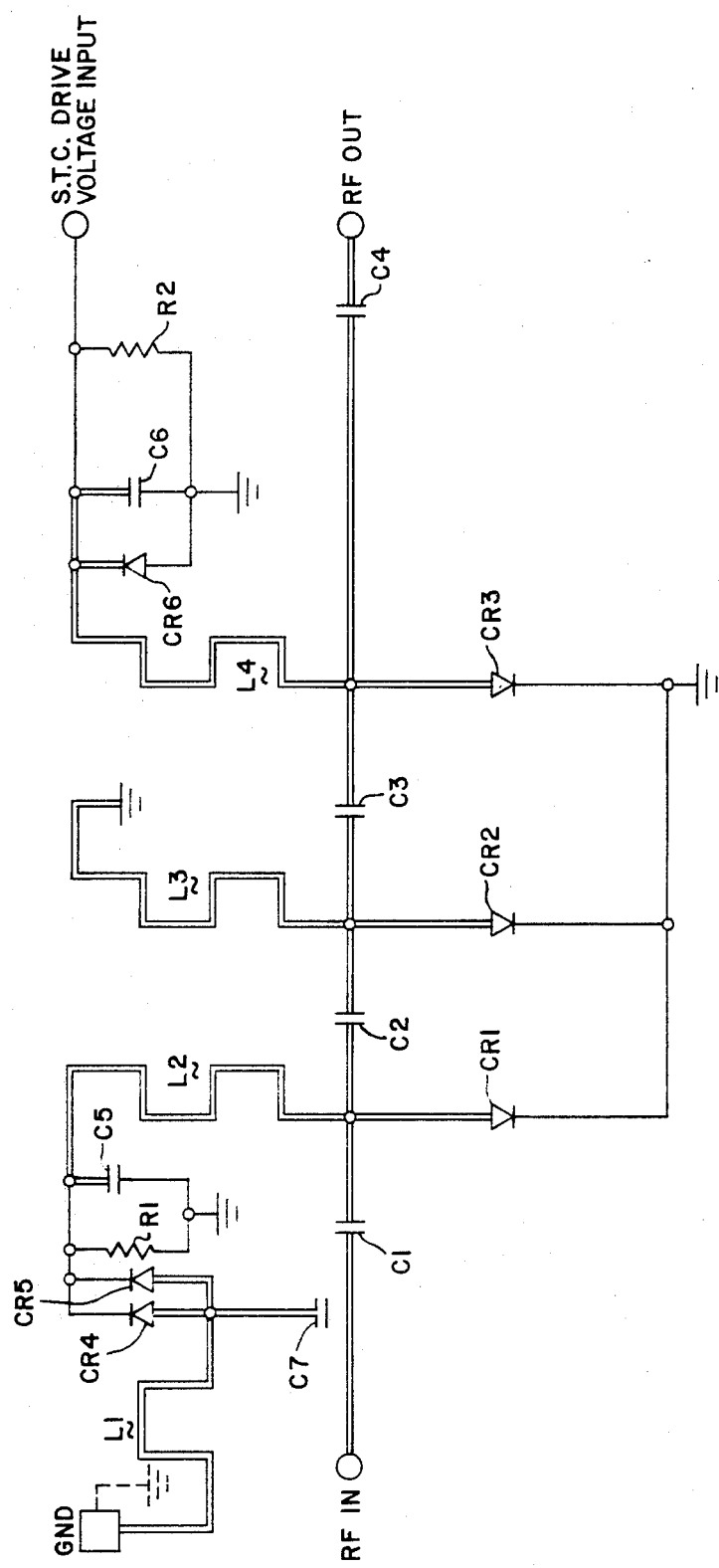
FIG. 1 is a simplified schematic circuit diagram of an embodiment of the invention.
Figure 2:
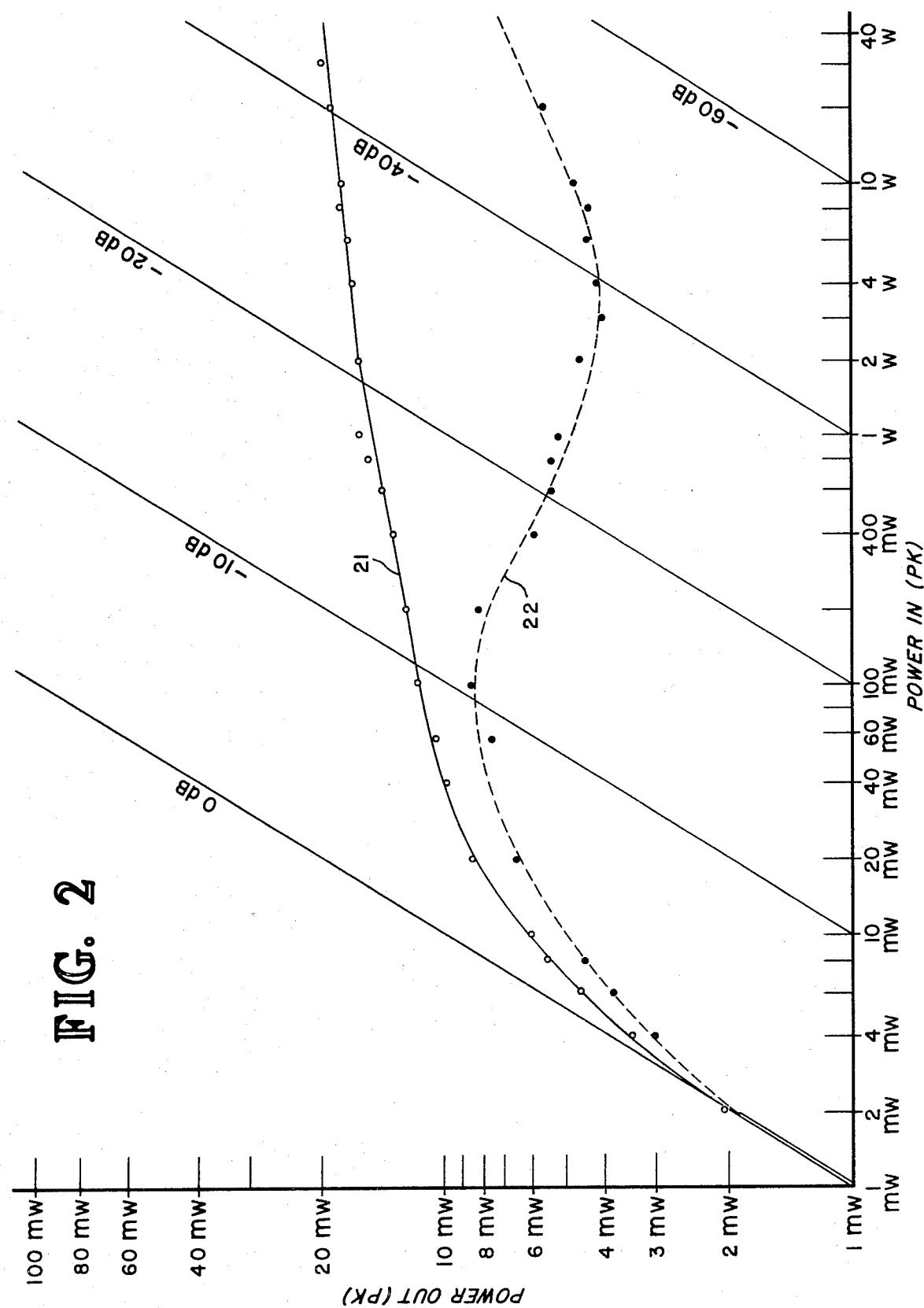
FIG. 2 is a graphic plot showing the high level limiting characteristics of a typical embodiment of the invention to spike signals and to flat characteristic signals.

Referring to FIG. 1 which is a simplified, (to the extent that the lead inductances to the PIN diodes are not shown), schematic diagram of an embodiment of the invention, the PIN diodes CR1, CR2, and CR3 have progressively smaller base regions. Typically, in an embodiment for operation in the "L" band the base width $\omega b$ equals approximately 8 micrometer for the input stage of CR1, 4 $\mu$m for the second stage CR2 and 2 $\mu$m for the low power output stage CR3. By using variable base region diodes (i.e., the thickness of the intrinsic region) a passive receiver protector is provided that has relatively low leakage power with fast recovery period. Typically, the 8 $\mu$m diode is a conventional thick PIN diode the 4 $\mu$m and 2 $\mu$m diodes are thinner silicon epitaxial mesa types with substantially zero bias punch-through characteristics in order to achieve lowest insertion loss. Typical high level limiting characteristis of the invention are shown in FIG. 2. Curve 21 is for spike response and curve 22 is for substantially flat response.

The quasi-active limiter action of the first stage uses a "discharging resistor" $R_1$ which allows the charge to rapidly decrease on CR1, the input high power PIN diode, thus achieving fast recovery, to less than 1 $\mu$sec. The turn-on ($\simeq$10 NS) bias of CR1 is supplied by rf current detected by the paralleled CR4 and CR5 Schottky barrier pair. A conventional probe coupler C7 samples rf power from the main rf line to drive the Schottky barrier diodes. It has been found desirable for embodiments of the invention for typically 200 watt long-pulse capability to use two Schottky barrier diodes CR4 and CR5, in order to achieve the desired current capability and still maintain the desirable high frequency characteristics.

The input stage (8 $\mu$m) is a critical element since it determines recovery period and peak pulse power handling capability and to a large degree leakage amplitudes. The second ($\omega_b = 4$ $\mu$m) stage is a straightforward limiter and the final stage ($\omega_b = 2$ $\mu$m) serves as a sensitive (approximately zero dBm turn-on) passive limiter during the transmit period and controlled STC, (sensitivity time control), or AGC, (automatic gain control), attenuator during receive. In this way one achieves rf attenuation of the echo in front of the LNA, (low noise amplifier), without an insertion loss penalty.

Figure 3:
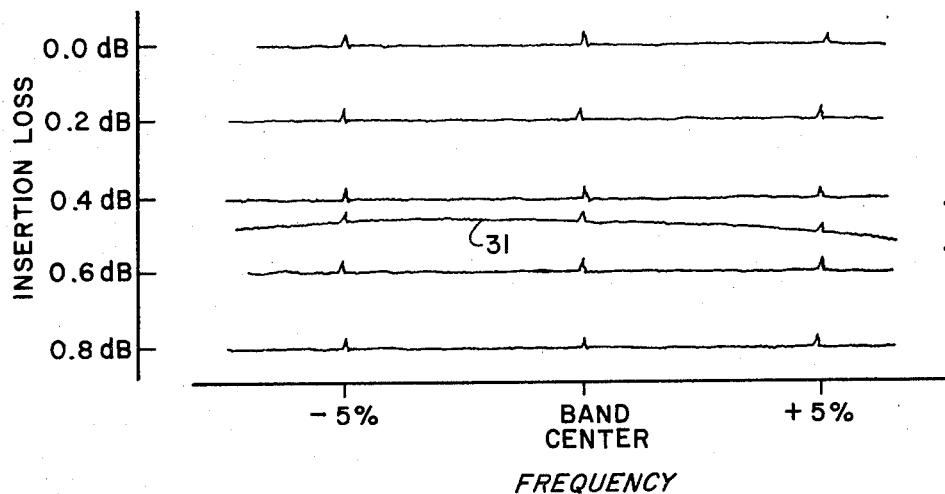
FIG. 3 is a graphic plot showing the insertion loss of a typical embodiment.
Figure 4:
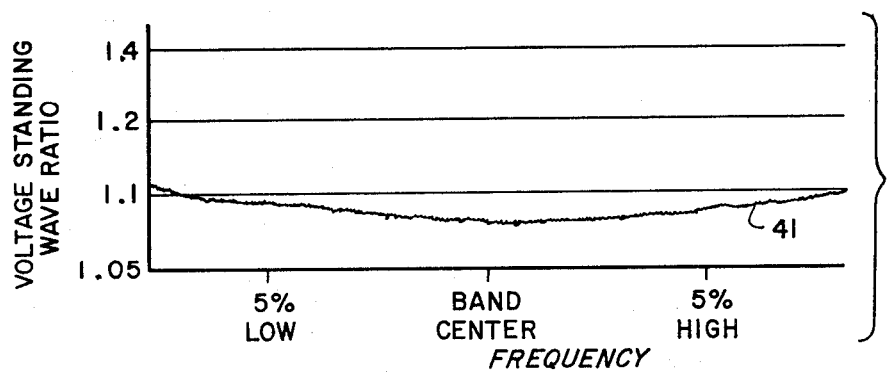
FIG. 4 is a graphic plot showing the voltage-standing-wave-ratio of a typical embodiment.

One of the most important parameters of an RP (receiver protection) system is insertion loss, which must be kept as low as possible so as not to increase the system noise factor (NF). Curve 31 of FIG. 3 shows the relatively low loss (approximately 0.5 dB) obtained with typical embodiments of the invention operating of the radar "L" band. FIG. 4 is a plot showing the VSWR over a portion of the "L" band. This low loss and low VSWR was obtained in embodiments of the invention by the unique fabrication of the PIN diodes in the system.

Figure 5:
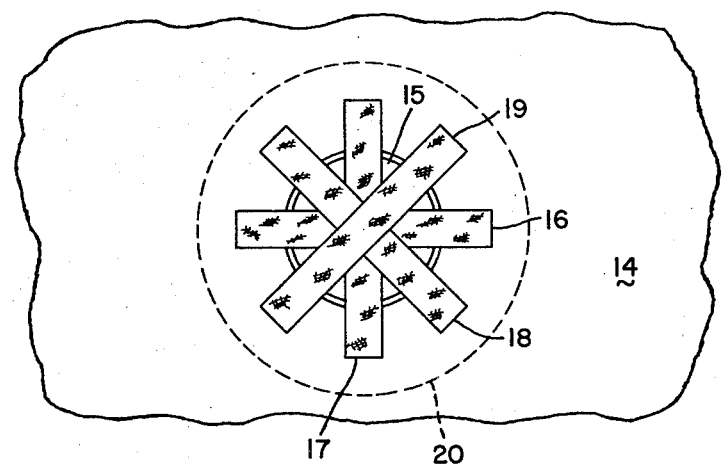
FIG. 5 is a schematic drawing showing in plan view the positioning of a copper puck in the circuit board.
Figure 6:
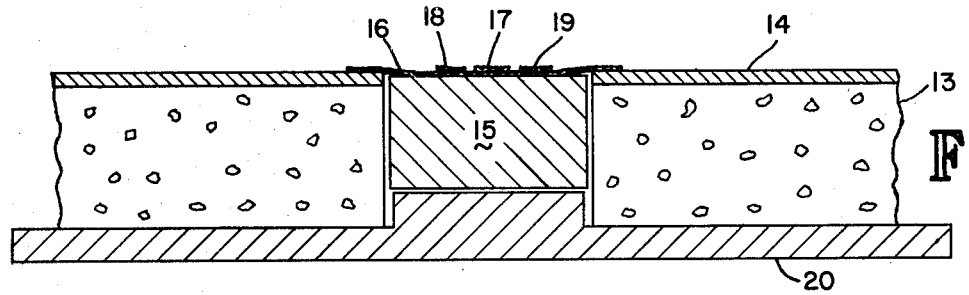
FIG. 6 is a schematic section view of the positioning of the copper puck in a circuit board.

The PIN diodes are mounted on individual gold-plated copper pucks. Generally, it is preferred to solder, with gold germanium solder, the gold plated N+ side of the PIN diode to the gold-plated puck. An alternative means of attaching the PIN diode to the puck is with low loss high conductance epoxy cement in place of the solder. FIG. 5 illustrates the bonding of the gold-plated copper puck 15 with four gold straps 16, 17, 18, and 19. Suitable straps may typically be 0.025×0.0005 gold strips. The gold strips are conventionally bonded to the ground plane 14 and the puck 15 by thermal compression ball wire bonding. The conventional chrome-gold ground plane 14 is conventionally positioned on the conventional typically 0.025 alumina substrate 13. (All dimensions are in inches.) FIG. 6 is an enlarged sectional view showing a jig 20 positioned in place for supporting the puck 15 during the bonding. This spoke bonding of the gold-plated copper puck reduces the RS (series resistance of the diode) to its lowest achievable value in order to obtain the lowest loss factor. This connection mates the N+ diode side to the ground plane providing the most efficient connection obtainable.

Figure 7:
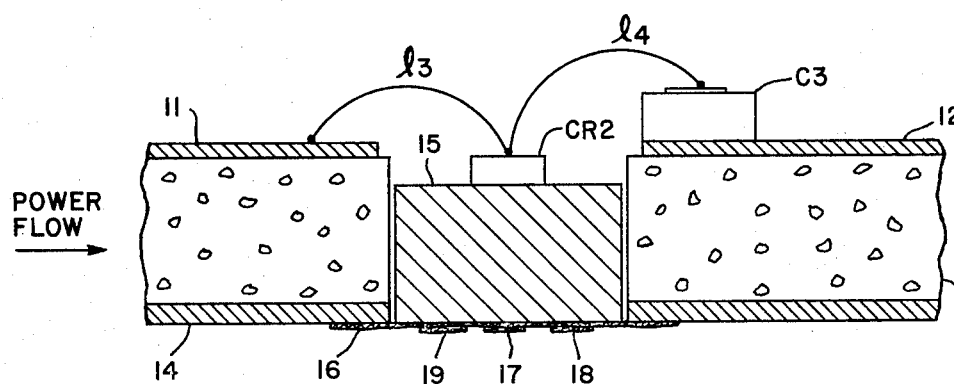
FIG. 7 is a schematic view illustrating a typical positioning of a PIN diode and a coupling capacitor on a circuit board.
Figure 8:
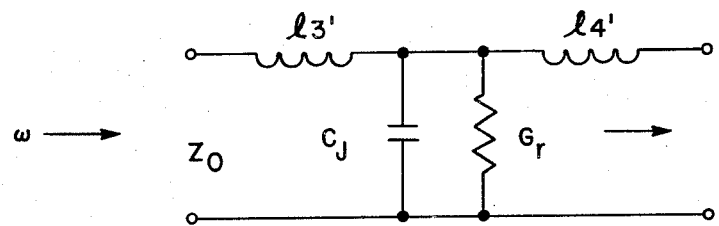
FIG. 8 illustrates a typical electrical equivalent circuit of a PIN diode with resonant leads as shown in FIG. 7.

FIG. 7 pictorially illustrates a PIN diode, (in this particular figure diode CR2), conventionally attached to puck 15, supported in the substrate 13, having ground plane 14, and fifty ohm RF line 11 and 12. It has been found desirable to vary lead lengths $l_3$ and $l_4$, connecting to the $P^{30}$ side of the PIN diode, to resonate with the junction capacitance of the diode. FIG. 8 schematically illustrates the equivalent electrical circuit of a diode and its connections. $l_3'$ is the equivalent inductance of lead $l_3$, $l_4'$ is the equivalent inductance of lead $l_4$, $C_J$ is the diode junction capacitance, and $G_r$ is the reverse bias shunt conductance of the diode. The effect of $G_r$ on the insertion loss $\alpha_L$ may be expressed by the following:

$$\alpha_1 = 10 \log_{10}[(1 + \frac{G_r Z_o}{2})^2 + (\frac{\omega C_J Z_o}{2})^2]$$

Figure 9:
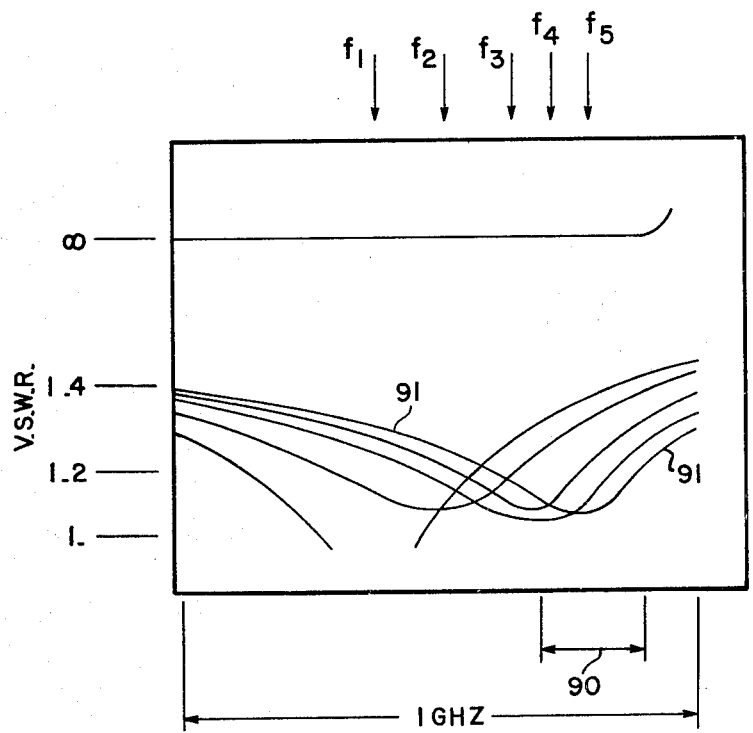
FIG. 9 is a plot made from oscilloscope traces illustrating the relationship of lead inductances going to a PIN diode with the voltage-standing-wave-ratio vs frequency characteristics.

FIG. 9 illustrates how the resonant point moves to higher and higher frequencies as the bond lead inductances are decreased. For a typical operating bandwidth 90 about a desired frequency $f_5$, leads having lengths providing curve 91 are considered optimum. The bonding strap and the lead resonating techniques have been found to greatly reduce the shunt conductance.

Blocking capacitors C1, C2, C3, and C4 are conventional microwave integrated circuit mountable capacitors. It has been found that the following capacitor types provide an approximate loss per unit as follows:

| | |
|---|---|
| a. interdigitated finger | = .05 dB/unit |
| b. MIS (metal insulator semiconductor) | = .03 dB/unit |
| c. MOS (metal oxide semiconductor) | = .035 dB/unit |
| d. MOM (metal oxide metal) | = .02 dB/unit |

Obviously, the lower loss units are preferred. Due to the newness of the MOM types and the lack of extensive reliability data currently available for them, the MIS capacitors will generally be preferred at the present time.

Figure 10:
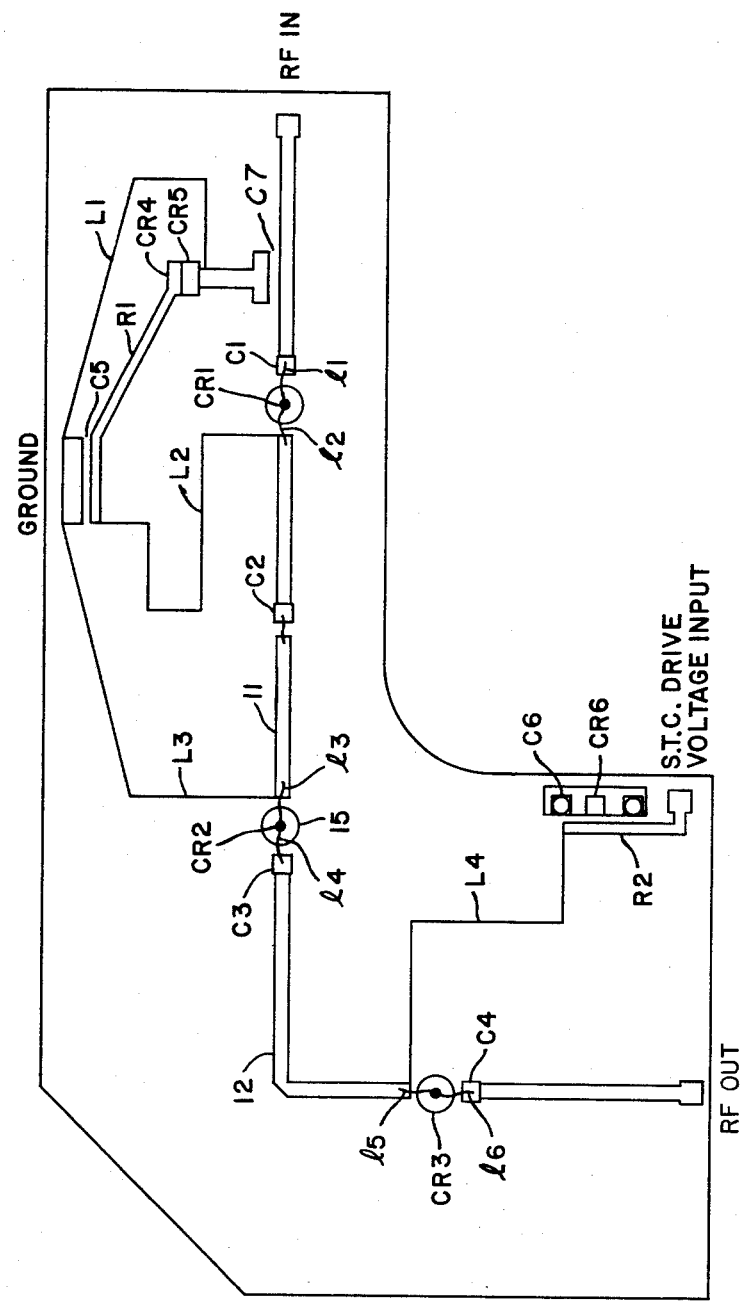
FIG. 10 is a pictorial view showing a typical structural layout of the invention.

FIG. 10 is a pictorial plan view of a typical operating embodiment for L band operation. The overall dimension of the card are approximately 1¾ inches long by 1 inch high. The 50 ohm line, of which 11 and 12 are sections, couples the input to the output. The three PIN diodes CR1, CR2, and CR3, are all supported on similar pucks with tuned coupling leads $l_1$, $l_2$, $l_3$, $l_4$, $l_5$, and $l_6$. One-quarter wavelength chokes L1, L2, L3, and L4 decouple the RF from the ground potential points. Typical values of STC drive voltages are from zero to +5 volts dc. Typical embodiments of the invention have operated very satisfactorily with input power as high as 200 watts at duty cycles as high as 10%.

We claim:

1. A microwave integrated circuit receiver protector for controlling the input to a radar receiver during periods of transmit and receive comprising:
   a. a circuit board substrate having a ground plane, a microwave input line, and a microwave output line of substantially the same impedance as the input line;
   b. an input PIN diode having a predetermined base region thickness coupled to with the said input line;
   c. means including a Schottky barrier diode coupled to with the said input line and the said input PIN diode for providing turn-on bias to the said input PIN diode;
   d. means including a discharge resistor coupled to with the said means for providing turn-on bias, and the said input PIN diode for providing fast recovery of the said input PIN diode from the said turn-on bias;
   e. an output PIN diode having a determined base region thickness that is less than the said input PIN diode base region thickness coupled to with the said output line;
   f. means for applying a dc voltage to the said output PIN diode whereby the said output PIN diode functions as a passive limiter during the transmit period and a controlled sensitivity time controlled attenuator during receive; and
   g. means including a limiting PIN diode coupling the said input PIN diode to the said output PIN diode.

2. The receiver protector as claimed in claim 1 wherein the said substrate has hole recesses and the said PIN diodes are each attached to gold-plates copper pucks positioned in a respective said hole in the said substrate and the said puck is bonded with gold bonding straps to the said substrate ground plane.

3. The receiver protector as claimed in claim 2 wherein the said PIN diodes have a gold-plates N+ side and a P+ side with conductor leads connected to the P+ side, the gold-plated N+ side soldered to the gold-plated copper puck and the said conductor leads connected to the P+ side of the PIN diode resonating the said PIN diode.

* * * * *

UNITED STATES PATENT AND TRADEMARK OFFICE
CERTIFICATE OF CORRECTION

PATENT NO. : 4,232,278

DATED : November 4, 1980

INVENTOR(S) : Michael J. Gawronski, et al

It is certified that error appears in the above-identified patent and that said Letters Patent are hereby corrected as shown below:

Col 1, line 19, after "pulses" insert --- going ---.

Col 2, lines 32-33, change "characteristis" to --- characteristics ---.

Col 4, line 28 (claim 1, part b) delete "with".
Col 4, line 30 (claim 1, part c) delete "with".
Col 4, line 34 (claim 1, part d) delete "with".
Col 4, line 40 (claim 1, part e) delete "with".
Col 4, line 51 (claim 2) change "gold-plates" to --- gold-plated ---.
Col 4, line 56 (claim 3) change "gold-plates" to --- gold-plated ---.

Signed and Sealed this

Twenty-fourth Day of March 1981

[SEAL]

Attest:

RENE D. TEGTMEYER

Attesting Officer     Acting Commissioner of Patents and Trademarks